(12) United States Patent
Dai et al.

(10) Patent No.: US 6,406,791 B1
(45) Date of Patent: Jun. 18, 2002

(54) MULTIPHASE DIELECTRIC COMPOSITION AND MULTILAYERED DEVICE INCORPORATING THE SAME

(75) Inventors: Xunhu Dai, Gilbert; Rong-Fong Huang, Tempe, both of AZ (US)

(73) Assignee: Motorola, Inc., Schaumburg, IL (US)

( * ) Notice: Subject to any disclaimer, the term of this patent is extended or adjusted under 35 U.S.C. 154(b) by 24 days.

(21) Appl. No.: 09/638,228

(22) Filed: Aug. 14, 2000

(51) Int. Cl.[7] .................. B32B 15/04; B32B 17/06; C04B 35/47
(52) U.S. Cl. .................. 428/432; 428/621; 501/135
(58) Field of Search .................. 428/209, 432; 501/135, 469

(56) References Cited

U.S. PATENT DOCUMENTS

| | | | |
|---|---|---|---|
| 4,438,214 A | * 3/1984 | Masuyama et al. | 501/136 |
| 4,992,398 A | 2/1991 | Huang et al. | 501/135 |
| 5,019,306 A | 5/1991 | Huang et al. | 264/66 |
| 5,801,108 A | 9/1998 | Huang et al. | 501/32 |
| 5,821,181 A | 10/1998 | Bethke et al. | 501/8 |
| 6,207,905 B1 * | 3/2001 | Taga et al. | 174/258 |

* cited by examiner

Primary Examiner—Deborah Jones
Assistant Examiner—Gwendolyn Blackwell-Rudasill
(74) Attorney, Agent, or Firm—William E. Koch

(57) ABSTRACT

A multiphase dielectric composition for a multilayered ceramic device (10), and devices incorporating the same, including a $(SrCa)TiO_3$ dielectric powder and a glass that is substantially free of lead having a weight ratio of about 35 to about 65 parts powder: about 65 to about 35 parts glass, and having a particle size of about 1 to about 2.5 micron (um) and having a dielectric constant (K) of about 18 to about 30 and an electrical Q of at least about 300 to about 550.

49 Claims, 2 Drawing Sheets

MULTIPHASE DIELECTRIC COMPOSITION AND MULTILAYERED DEVICE INCORPORATING THE SAME

FIELD OF THE INVENTION

The present invention relates to dielectric compositions for electronic applications, and more particularly to a low loss, substantially lead free dielectric composition that is co-fireable with a ceramic material for forming multilayer ceramic devices.

BACKGROUND OF THE INVENTION

The use of green ceramic tapes has become popular in the manufacture of multilayer ceramic devices for routing electronic circuitry. U.S. Pat. No. 5,801,108 (hereby expressly incorporated by reference herein) addresses various engineering constraints encountered in the manufacture of such devices. Desirably, such devices will exhibit attractive values of "Q", a dimensionless property in the radio frequency field that is inversely related to the loss factor of a given material (i.e., higher Q values correspond to lower loss).

It is becoming more popular to build such devices by using a ceramic green tape, and building layers on the tape. One way to do this is to employ a paste of a desired material, such as a desired particulated material in a suitable binder. Upon processing, the binder is eliminated and the particulates of the desired material sinter to form a more densified structure. There is a need for improved materials for making such devices, and preferably materials that are substantially free of lead, have relatively flexible processing characteristics, and exhibit an attractive dielectric constant and Q value.

DETAILED DESCRIPTION OF THE DRAWINGS

Figure 1:
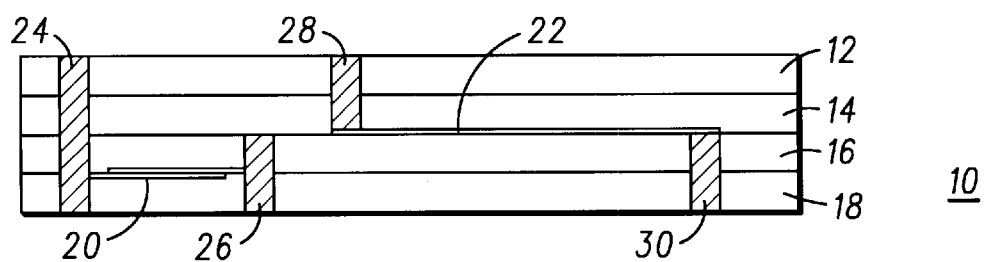
FIG. 1 illustrates a cross-sectional view of a multilayer ceramic device in accordance with the present invention.

The invention relates to a dielectric composition (including a paste form thereof), multilayer ceramic devices, and methods of fabricating such devices. In a particularly preferred embodiment, the desired dielectric composition of the present invention generally possesses electrical properties such as a dielectric constant (K) of approximately between 15 and 60 and more preferably about 18 to about 30 and an electric Q property of at least about 250 to about 550, and more preferably about 300 to about 520 when measured at about 10 MHz, with like results across a broad range of frequencies, e.g., to about 170 MHz, more preferably about 410 MHz and still more preferably to about 500 MHz. The composition is cofireable with a ceramic green tape at temperatures of approximately 850 to 900, and more preferably about 875° C. Moreover, the composition has a particle size and solids content that allows it to be screen printable using conventional techniques. The density ranges (archimedes or volume density measurement) from about 1.7 to about 3.2 g/m$^2$, and more preferably about 2.4 to about 3 g/m$^2$.

It is generally known in the art that the capacitance of a capacitor embedded in a multilayered package is related to the dielectric constant of a dielectric material and the thickness of the dielectric layer according to the following equation:

$$C=(eNAK)/t$$

where C is the capacitance of the capacitor inside the multilayer ceramic package; e is a constant; N is the number of active layers used to build the multilayered ceramic package; K is the dielectric constant of the dielectric; A is the area of the electrodes; and t is the thickness or distance between the capacitor plates in the multilayered package.

Closer analysis of this equation reveals that if the value of A is constant, a desired capacitance can be achieved by adjusting either the number of active layers N or the ratio of K/t. For traditional multilayer packages, the K value is small and the t is large (green tapes are typically approximately 0.045 mils thick, with a K of about 7.3). Thus, for traditional multilayered packages, the ratio of K/t is usually very small. In order to achieve a predetermined capacitance (C) value, N often must be large; thus, many layers are required to build the capacitor. However, by using a composition such as a dielectric having a K value of about 18 to about 30, as described hereinbelow, and applying this dielectric in very thin layers, (dielectric paste may be applied in layers approximately 0.0005–0.0007 inches thick), the ratio of K/t can be much larger than in traditional multilayer ceramic packages. Thus, a multilayer package using the dielectric composition of the present invention, and preferably in a dielectric paste form, can employ fewer active layers, resulting in reduced costs and processing steps.

For producing devices in accordance with the present invention, a preferred dielectric composition is one that is process-compatible with a suitable green ceramic tape material, to thereby help avoid potentially adverse chemical reactions occurring at the paste/tape interface. Moreover, the particle size of the particulate in the composition is such that any shrinkage between the green tape and the dielectric paste upon firing is controllably managed or otherwise is inconsequential. Preferably, the composition of the present invention is processed in a form (such as a paste) that has a particle size, content and rheology to readily handle the material and allow the composition to be screen-printed. In a particularly preferred embodiment of the present invention, the composition of the present invention is in a paste form, with the paste including, but not limited to:

a) a particulated dielectric (e.g., powder) composition;

b) a glass composition which will interact with the dielectric powder in a predetermined environment to at least partially form a crystallized phase; and c) a consumable binder material.

Upon sintering for a predetermined amount of time at a predetermined temperature, the dielectric powder interacts with the glass and the binder material is consumed. Preferably, the resulting material is at least partially densified and includes a plurality of different phases.

In one preferred embodiment, the particulated dielectric employed in the composition of the present invention is a powder of strontium calcium titanate (referred to herein also by the shorthand designation "SCT"), such as (SrCa)TiO$_3$, or otherwise more broadly represented as (Sr$_x$Ca$_{1-x}$)TiO$_3$, wherein x ranges from about 0.5 to about 0.7. In a particularly preferred embodiment, the particulated dielectric is prepared from commercially available starting materials, and more preferably, the commercial forms of TiO$_2$ (e.g., Fuji available from DuPont), SrCO$_3$ (e.g., from Kali Chemie AG, lot 061088), and CaCO$_3$ (e.g., from Solvay Performance Chemical, lot NR 588) all of which preferably have a purity of about 99%. Of course, other particulated dielectrics may be suitably employed. See, e.g., commonly assigned U.S. Pat. No. 5,801,108 entitled "Low Temperature Cofireable Dielectric Paste", to Huang, et al; commonly assigned U.S. Pat. No. 4,992,398 entitled "High Frequency Dielectric Composition", to Huang, et al.; and U.S. Pat. No. 5,019,306 entitled "High Frequency Dielectric Composition", also to Huang, et al, the disclosures of which are incorporated herein by reference for all purposes.

The glass for admixing with the dielectric powder to form a paste in accordance with the present invention preferably is a ceramic composition that is substantially free of lead (i.e., any lead present is present in an amount less than about 5 weight percent, more preferably less than about 3 weight percent and still more preferably less than about 1 weight percent), and more preferably it is entirely free of lead (exclusive of trace impurities). Though a variety of suitable glass materials may be used, in one embodiment, the glass specifically includes compounds including an element selected from the group consisting of K, Mg, B, Si, Ca, Sr, Ba, Li, Na and mixtures thereof, and more preferably Si, B or both and one or more element selected from the group consisting of Mg, Ca, Sr, Ba and mixtures thereof or K, Na, Li or a mixture thereof. In a particularly preferred embodiment, the glass includes K, B, Si, Ca, Sr, Ba or mixtures thereof. Preferably, the compounds are oxides, or a mixture or different oxides. Of course, other substantially lead-free compounds may be employed, such as borides, carbides, nitrides, mixtures of the latter with an oxide, or mixtures thereof. In one embodiment, the glass is crystallizable. Additional examples of suitable glass elements (or precursors thereof) include other alkaline earth metals, such as described in U.S. Pat. No. 5,821,181, which is incorporated herein by reference for all purposes.

As will be described in greater detail below, one preferred composition has a weight ratio of about 35 to about 65 parts powder: about 65 to about 35 parts glass, and more preferably about 38 to about 62 parts powder: to about 62 to about 38 parts glass, and still more preferably about 45 to about 55 parts powder: to about 55 to about 45 parts glass. The glass used in this dielectric paste composition optionally may react with the particulated dielectric powder upon firing, for crystallizing and forming a calcium titanate silicate phase.

In forming a paste using the composition of the present invention, it is preferable to employ a suitable binder, such as one that can be consumed. By way of example, an organic binder material may be employed in combination with the dielectric powder and glass. In one embodiment, the organic binder material is a polymer, and more preferably one that is dispersed in a fluid or is dissolved in at least one, and preferably several solvents. The polymer used in the organic binder may be any of those known in the art, and in one preferred embodiment it is a suitable cellulose, such as ethyl cellulose. Without limitation, other acceptable polymers include other polymers of various molecular weights and grades, examples of which include methyl-cellulose, nitrocellulose, and combinations thereof.

In a particularly preferred embodiment, the polymer is dissolved in a combination of different solvents for controlling the drying times of the polymer, it being recognized that different solvents or mixtures thereof will evaporate at different rates. In one preferred embodiment, the solvents used are volatile organic solvents suitable for dissolving the polymer, and may include one or a combination of alpha-terpineol, ester alcohol, and diethylene glycol monobutyl ethyl. Other solvents, which may be used include, but are not limited to, terpineols such as betaterpineol, isopropanol, and combinations thereof. Of course, with some polymers, water may be employed as a solvent or carrier.

The organic binder may further include other agents as desired, such as plasticizers adapted to enhance the mechanical properties thereof. Examples of preferred plasticizers include dioctylphthlate, dibutylphthlate and other phthlates. Also included in the organic binder may be antioxidation elements provided to help preserve the polymer while it is suspended in solvent. One example of a referred antioxidant material is butylated hydroxyl toluene (BHT). The skilled artisan will be familiar with others.

The organic binder may further include dispersion gents or surfactants and thickening agents to enhance the properties of the dielectric pastes. Dispersants such as a methyl quantanary of propoxylated diethylethanolamine (such as EMCOL cc-42), lipophilic acid neutralized complex amines (such as WITCAMINE) or a mixture thereof may be added to the mixture to enhance the dispersion of the particles therein. The thickening agents may be one of several known in the art, and include amorphous colloidal silicon dioxide known in the industry as CABO-SIL, finely divided powder organic derivatives of CASTROL oil such as glyceryl tris hydroxyl stearate (e.g., THIXIN-A) and Theological additives i.e. organically modified hectorite clay such as Bentone 128.

One particularly preferred blend (expressed in approximate relative amounts) for the organic binder includes a mixture ethyl cellulose (4–8 parts by weight), ester alcohol (0.5–12 parts by weight), diethylene glycol monobutylether (0–20 parts by weight), dioctylphthlate (0–20 parts by weight), and abutylated hydroxytoluene (0–5 parts by weight), with balance being alpha terpenol. Viscosity modifiers added to the composition include a Bentone 128 (about 5.5 parts by weight) and THIXIN E thickener (about 2.0 parts by weight). Viscosity modifiers and thickeners are added in the range of about 0.6 wt % (in total) in addition to the paste to achieve the desired viscosity level. Prior to firing (e.g., in a kiln or suitable furnace), the binder in a paste will occupy about 20 to about 40 volume percent of the paste (though higher or lower volumes may be suitably employed). Thus, the inorganic portion is present in an amount of about 60 to about 80 percent by weight of the overall paste composition. The particle size of solids preferably is about 1 to about 2.5 micron.

Employing the dielectric powder, glass, and organic binder, all as described hereinabove, it is possible to provide a dielectric paste which can be easily screen printed on the stainless steel mesh screen over the ceramic green tape composition and then cofired in an air atmosphere at approximately 850° to about 900°, and more preferably about 875° C.

Any suitable heating sequences may be employed. For example, in one embodiment, ingredients are heated from about room temperature to about 500° C. at a rate of about 5° C./min, then held at 500° C. for about 1 hour. Thereafter, it is heated from about 500° C. to about 875° C. at about 5° C./min and held at about 875° C. for about one half hour. Thereafter, it is cooled to room temperature at any suitable rate (e.g., about 5° C./min).

Using the dielectric powder, glass, and organic binder starting materials as described hereinabove, and wherein said starting materials are provided in relative proportion on one another as described hereinabove, the material resulting from said mixture after firing is a multiphased dielectric material wherein at least one phase is an alkaline earth metal transition metal silicate. More particularly, alkaline earth metal transition metal silicate consists of an alkaline earth metal selected from the group of calcium, barium, strontium, magnesium and combinations thereof. The transition metal element is selected from the group of titanium, zirconium, niobium, zinc, and combinations thereof. Accordingly, and in one preferred embodiment, the alkaline earth metal transition metal silicate phase is a calcium titanium silicate phase formed in the dielectric paste.

The resulting multiphased dielectric may similarly have second phase, which is a borosilicate phase. A third phase of which the multiphase dielectric paste may be comprised is a titanate phase and particularly a titanate phase including an alkaline earth metal. Examples of the titanate phase in the multiphase dielectric paste include strontium calcium titanates, barium calcium titanates, calcium magnesium titanates, barium strontium titanates, and combinations thereof. Each of the phases is substantially free of lead.

In general, devices in accordance with the present invention are made by applying a first layer of conductive (e.g. silver) paste on a ceramic green tape, applying a layer of a dielectric paste of the composition of the present invention over the first layer of paste, and applying a second layer of conductive (e.g. silver) paste over the layer of dielectric paste. The materials are cofired to result in a conductive layer over a dielectric layer over a conductive layer, and preferably also over a dielectric substrate.

Figure 2:
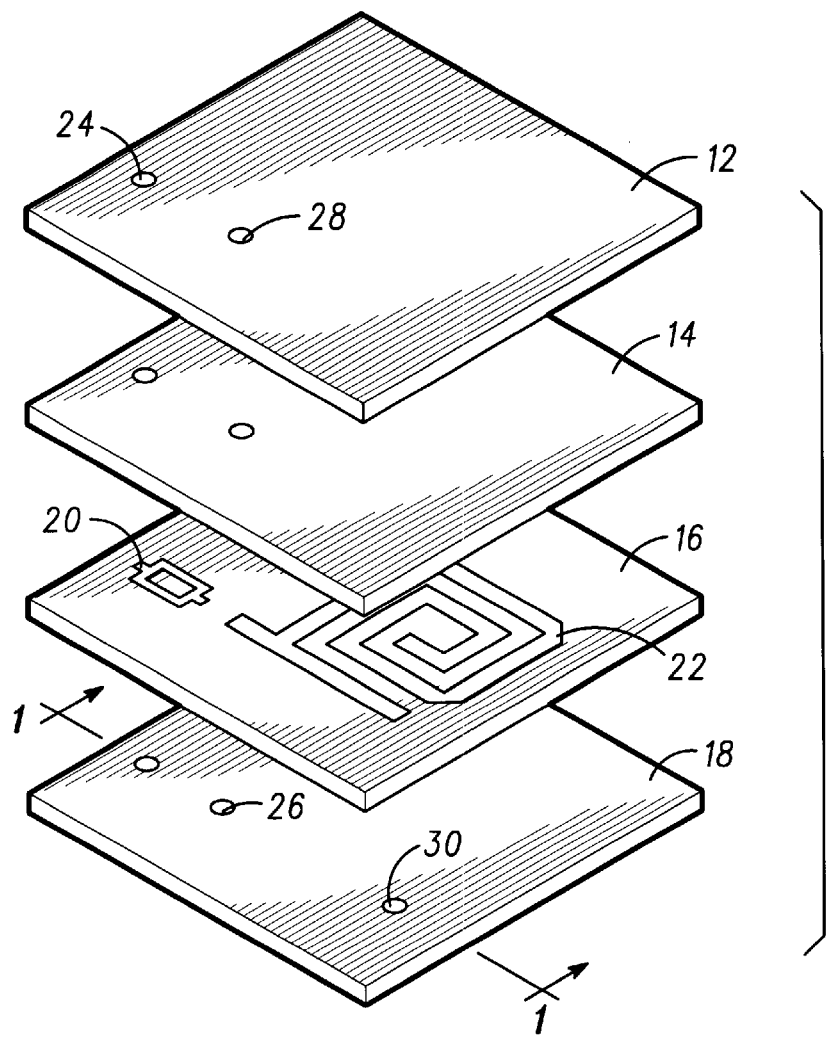
FIG. 2 illustrates an exploded view of the multilayer ceramic device of FIG. 1 in accordance with the present invention.

By way of further illustration, referring to FIGS. 1 and 2, there is illustrated therein a cross-sectional side view and an exploded view of a multilayered ceramic module employing a dielectric paste in accordance with the instant invention. The module 10 is comprised of a plurality of layers of ceramic materials 12, 14, 16, and 18, each of said materials being fabricated of ceramic materials as are well known in the art. Formed in and between the layers may be a plurality of electrical circuit elements such as elements 20 and 22 in FIG. 3. More particularly, element 20 may be, for example, a capacitor device, while element 22 may be a transmission line or induction. Electrical communication is made between the circuit elements 20 and 22 and the external regions of the module 10 by forming a plurality of vias 24, 26, 28 and 30 on layers of ceramic material, in a manner such that the vias are disposed one atop the other. Electrical communication is affected by disposing electrically conductive material such as, for example, silver, in the vias and on electrical conductive lead lines up to the circuit elements 20 and 22. While the electrical elements illustrated in FIGS. 1 and 2 are a capacitor and an inductor, it is to be understood that any type of electrical circuit may be employed in connection with the instant invention. However, in an effort to better understand the instant invention, the capacitor element 20 illustrated in FIGS. 1 and 2 will be described hereinbelow with respect to FIG. 3.

Figure 3:
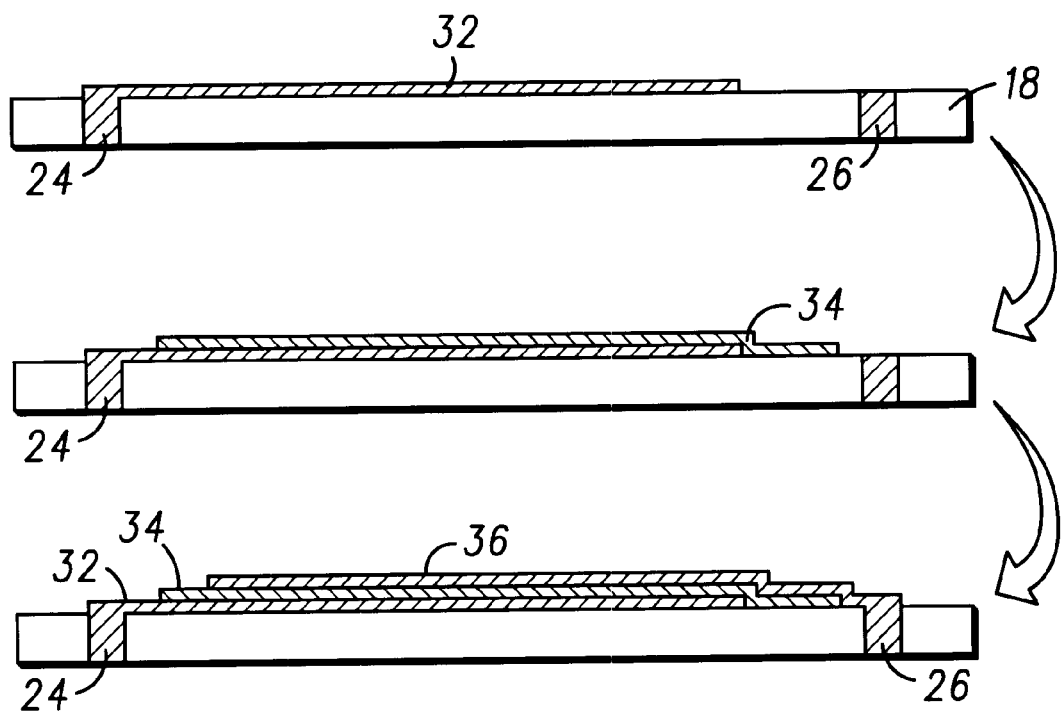
FIG. 3 illustrates an example of processing steps to manufacture a multilayer ceramic device in accordance with the present invention.

Referring now to FIG. 3 there is illustrated therein the steps for forming capacitor device illustrated in FIGS. 1 and 2. By using the dielectric paste material described above, it may be appreciated from FIGS. 1 and 2, that the layer of ceramic materials illustrated in FIG. 3 is layer 18. Formed through layer 18 and illustrated in FIG. 3 are vias 24 and 26, as well as an electrode layer 32, each of which vias and the electrode layer being fabricated of a deposited electrically conductive material including for example, silver, nickel, copper, gold, silver, platinum, palladium, and combinations thereof. In a preferred embodiment, the electrically conductive material formed in the vias and used to form the electrode layer 32 is silver due to its preferred thermal firing characteristics. That is, silver fires at about 850° C. (the approximate temperature at which the dielectric paste and the ceramic tape fire) without significant shrinkage, and with a resulting close thermal expansion of both the dielectric paste and the ceramic tape.

Disposed atop the electrode layer 32 is a layer of the dielectric paste material described hereinabove. Disposed over the layer of dielectric material 34 is a second electrode 36 in electrical communication with via 26. Electrode layer 36 is fabricated, like electrode layer 32, of a material such as silver. As may be appreciated from FIG. 3, electrode layer 32 is electrically coupled to via 26. Thus, by making electrical contact with vias 24 and 26, a charge may be applied and stored in the capacitor created by electrode layers 32, and 36 and having the dielectric paste 34 disposed therebetween.

As noted hereinabove, while FIGS. 1–3 illustrate the fabrication of a capacitor device within a multilayered ceramic module, the invention is not so limited. The dielectric paste material described in detail herein can be advantageously employed in a number of different circuit elements. Moreover, since the devices can be fabricated on a single layer, and since the required dielectric constant can be achieved by using the paste as opposed to multiple layers of ceramic material, both device size and costs are reduced as is manufacturing complexity of the multilayered ceramic modules.

EXAMPLE ONE

Synthesis of Particulated Dielectric (SCT Ceramic Powder)

Suitable amounts of the starting materials are provided. By way of example about 592 parts by weight of $SrCO_3$ is admixed with about 202 parts $CaCO_3$, and about 482 parts $TiO_2$. Water is added (e.g., at least about 510 parts) along with about 11 parts Tamoll and about 5000 parts of separable $ZrO_2$ balls. The materials are admixed and calcined. For example the materials are admixed for about 4 hours, dried in a steel pan at about 90° C., and calcined in an alumina crucible at about 1150° C. for about 4 hours. Resulting material has a density of about 4.7 g/cm3, a $d_{50}$ particle size of about 1.65 microns and a surface area of about 2.1 m2/g. The resulting molecular weight is about 167.59 and the resulting formula is about $Sr_{0.665}Ca_{0.355}TiO_3$, and has a dielectric constant of about 250. An X-ray diffraction pattern of the calcined powder shows a single perovskite phase, similar to that of pure $SrTiO_3$.

EXAMPLE TWO

Synthesis of Glass

A 100 gram glass composed of 4.7 wt % of $K_2O$, 14.2 wt % $B_2O_3$, 49.9 wt % $SiO_2$, 15.5 CaO, 8.5 wt % SrO and 7.2 wt % BaO is made with starting materials of $SiO_2$, $H_3BO_3$, $K_2CO_3$, $CaCO_3$, $SrCO_3$ and $BaCO_3$. The combined constituents are mixed and placed into a platinum crucible. The mixture is slowly heated past the decomposition temperature of the carbonates to avoid gas evolution that would push materials out of the crucible. The mixture is then heated to about 1100° C. and held for about 4 hours to enhance the mixing of the components. The molten material is then poured into water thereby creating a frit. The frit is hand ground to pass through a 325 mesh sieve, and ball milled to a final particle size between about 2.5 and 3.0 microns.

EXAMPLE THREE

Synthesis of Multiphase Dielectrics

A series of compositions, x wt % SCT+(1–x) wt % glass, at x=0.35, 0.40, 0.45, 0.50, 0.55 and 0.60 are formulated.

Starting powders are mixed in water with zirconia media for 4 hours and then dried at 90° C. Pellets at a diameter of about 0.75 mm are made after introducing a small amount of binder into the dried powder. The pellets are sintered typically at about 875° C. for about 0.5 hour after a binder urn out at about 450° C. for about 1 hour. A wafer of approximately 1 mm in thickness is sliced from the pellets. A suitable silver paste (e.g., commercially available from DuPont) is painted on both sides of the wafer. The silver is fired to the wafer at 600° C. for 1 hour to form a parallel plate capacitor. The capacitor is used to terminate a transmission line with a capacitor grounded on the opposite side. From $S_{21}$ measurement the dielectric constant K and the inverse of the dielectric loss factor Q are calculated.

TABLE 1

Density and dielectric properties of a series SCT/glass mixtures.

| SCT/glass By weight | Density g/cm3 | K (0.5 GHz) | Q (0.5 GHz) |
| --- | --- | --- | --- |
| 65/35 | 2.38 | 20.8 | 507 |
| 60/40 | 2.47 | 22.1 | 482 |
| 55/45 | 3.05 | 25.4 | 470 |
| 50/50 | 2.82 | 24.9 | 432 |
| 45/55 | 2.03 | 18.2 | 432 |
| 40/60 | 1.77 | N/A | N/A |

Table 1 lists the density and dielectric properties of formulations at a series of SCT/glass ratios. It is possible that the density of SCT/glass=40/60 (by weight) may be too low to form good samples to K and Q tests.

EXAMPLE FOUR

Making of a Dielectric Paste

About 50 grams of a SCT powder/glass admixture is prepared at a weight ratio of 55/45 (powder to glass), and gradually mixed with about 0.77 gram Emcol CC-42 dispersant, about 15.10 gram of alpha terpineol and 13.42 grams of an organic vehicle made of ethyl cellulose. The mixture is put through a 3-roll mixer three times to make a substantially homogeneous paste under high shear mixing. The paste is then placed on a slow roller and is rendered ready for use.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A multiphase dielectric composition for multilayered ceramic devices, comprising:

a (SrCa)TiO$_3$ dielectric powder and a glass that is substantially free of lead having a weight ratio of about 35 to about 65 parts powder: about 65 to about 35 parts glass, and having a particle size of about 1 to about 2.5 micron and having a dielectric constant (K) of about 18 to about 30 and an electrical Q of at least about 300 to about 550.

2. A multiphase dielectric composition for multilayered ceramic devices, comprising:

a dielectric powder including $(Sr_xCa_{1-x})TiO_3$, wherein x ranges from about 0.5 to about 0.7; and a glass that is substantially free of lead, said glass including an element selected from the group consisting of K, B, Si, Ca, Sr, Ba and mixtures thereof;

said composition having a weight ratio of about 35 to about 65 parts powder: about 65 to about 35 parts glass, and having a particle size of about 1 to about 2.5 micron and having a dielectric constant (K) of about 18 to about 30 and an electrical Q of at least about 300 to about 550.

3. A multiphase dielectric composition for multilayered ceramic devices, comprising:

a dielectric powder including $(Sr_xCa_{1-x})TiO_3$, wherein x ranges from about 0.5 to about 0.7; and a crystallizable glass that is substantially free of lead, said crystallizable glass including an admixture of K$_2$O, B$_2$O$_3$, SiO$_2$, CaO, SrO, and BaO;

said composition having a weight ratio of about 35 to about 65 parts powder: about 65 to about 35 parts glass, and having a particle size of about 1 to about 2.5 micron and having a dielectric constant (K) of about 18 to about 30 and an electrical Q of at least about 300 to about 550 when measured to about 500 MHz.

4. A multilayered ceramic device, comprising:

a first layer of material;

a second layer that is substantially free of lead, said second layer including an admixture of a (SrCa)TiO$_3$ dielectric powder and a crystallizable glass that is substantially free of lead having a weight ratio of about 35 to about 65 parts powder: about 65 to about 35 parts glass, and having a particle size of about 1 to about 2.5 micron and having a dielectric constant (K) of about 18 to about 30 and an electrical Q of at least about 300 to about 550.

5. A composition according to claim 1 wherein said powder has the formula $(Sr_xCa_{1-x})TiO_3$, wherein x ranges from about 0.5 to about 0.7.

6. A composition according to claim 1, wherein said crystallizable glass includes an element selected from the group consisting of K, B, Si, Ca, Sr, Ba and mixtures thereof.

7. A composition according to claim 6, wherein said crystallizable glass includes an admixture of at least two components selected from the group consisting of K$_2$O, B$_2$O$_3$, SiO$_2$, CaO, SrO, BaO and mixtures thereof.

8. A composition according to claim 4 wherein said powder has the formula $(Sr_xCa_{1-x})TiO_3$, wherein x ranges from about 0.5 to about 0.7.

9. A composition according to claim 4, wherein said crystallizable glass includes an element selected from the group consisting of K, B, Si, Ca, Sr, Ba and mixtures thereof.

10. A composition according to claim 9, wherein said crystallizable glass includes an admixture of at least two components selected from the group consisting of K$_2$O, B$_2$O$_3$, SiO$_2$, CaO, SrO, BaO and mixtures thereof.

11. A composition according to claim 2, wherein said crystallizable glass includes an admixture of at least two components selected from the group consisting of K$_2$O, B$_2$O$_3$, SiO$_2$, CaO, SrO, BaO and mixtures thereof.

12. A composition according to claim 2, wherein said compositon is in the form of a paste.

13. A composition according to claim 3, wherein said composition is in the form of a paste.

14. A composition according to claim 3, wherein said glass includes about 5 parts K$_2$O, about 14 parts B$_2$O$_3$, about 50 parts SiO$_2$, about 16 parts CaO, about 8 parts SrO and about 7 parts BaO.

15. A composition according to claim 3 wherein said SiO$_2$ is present in an amount greater than any other compound in said glass.

16. A composition according to claim 15, wherein said $SiO_2$ is present in amount greater than about three times the amount of any other compound in said glass.

17. A composition according to claim 15 wherein the total amount of compounds other than $SiO_2$ is less than about 50% of said glass.

18. A composition according to claim 1 wherein said powder has a density of about 4.7 g/cm3.

19. A composition according to claim 1 wherein said powder has an average particle size of about 1.7 um.

20. A composition according to claim 1 wherein powder has a surface area of about 2 $cm^2/g$.

21. A composition according to claim 2 wherein said powder has a density of about 4.7 $g/cm^3$.

22. A composition according to claim 2 wherein said powder has an average particle size of about 1.7 um.

23. A composition according to claim 2 wherein powder has a surface area of about 2 $cm^2/g$.

24. A composition according to claim 3 wherein said powder has a density of about 4.7 $g/cm^3$.

25. A composition according to claim 3 wherein said powder has an average particle size of about 1.7 um.

26. A composition according to claim 3 wherein powder has a surface area of about 2 $cm^2/g$.

27. A device according to claim 4 wherein said powder has a density of about 4.7 $g/cm^3$.

28. A device according to claim 4 wherein said powder has an average particle size of about 1.7 um.

29. A device according to claim 4 wherein powder has a surface area of about 2 $cm^2/g$.

30. A composition according to claim 1, further comprising a solvent, dispersant, binder or a mixture thereof and wherein said composition is in the form of a paste.

31. A composition according to claim 2, further comprising a solvent, dispersant, binder or a mixture thereof and wherein said composition is in the form of a paste.

32. A composition according to claim 3, further comprising a solvent, dispersant, binder or a mixture thereof and wherein said composition is in the form of a paste.

33. A composition according to claim 30, wherein the inorganic portion of said composition is present in an amount of about 60 to about 80 percent by weight of the overall composition.

34. A composition according to claim 31, wherein the inorganic portion of said composition is present in an amount of about 60 to about 80 percent by weight of the overall composition.

35. A composition according to claim 32, wherein the inorganic portion of said composition is present in an amount of about 60 to about 80 percent by weight of the overall composition.

36. A composition according to claim 1 wherein said powder has a dielectric constant K of about 250.

37. A composition according to claim 2 wherein said powder has a dielectric constant K of about 250.

38. A composition according to claim 3 wherein said powder has a dielectric constant K of about 250.

39. A device according to claim 4, wherein said powder has a dielectric constant K of about 250.

40. A device according to claim 4, wherein said first layer is a conductive metal containing layer disposed on a first portion of said second layer.

41. A device according to claim 40, wherein said first layer includes silver.

42. A device according to claim 40, further comprising a third layer disposed on a second portion of said second layer.

43. A device according to claim 42, wherein said third layer is a conductive metal containing layer.

44. A device according to claim 43, wherein said third layer includes silver.

45. A device according to claim 43 wherein said second layer includes a ceramic substrate.

46. A device according to claim 45, wherein said ceramic substrate is a tape.

47. A device according to claim 46, wherein said first layer is generally parallel to said third layer for providing a capacitor.

48. A device according to claim 47, wherein said first layer is connected to a transmission line and said third layer is connected to a ground.

49. A composition according to claim 3, wherein said glass includes a weight ratio of about 2–25% $K_2O$, about 10–25% $B_2O_3$, about 35–67% $SiO_2$, about 5–35% CaO, about 5–35% SrO and about 5–35% BaO.

* * * * *